US005134418A

United States Patent [19]

Gomez et al.

[11] Patent Number: 5,134,418

[45] Date of Patent: Jul. 28, 1992

[54] APPARATUS FOR SENSING THE INTEGRITY OF A WRISTBAND ANTENNA

[75] Inventors: Fernando Gomez, West Palm Beach; Randi L. Dulaney, Boca Raton; Michael P. Goldenberg, Boynton Beach, all of Fla.

[73] Assignee: Motorola, Inc., Schaumburg, Ill.

[21] Appl. No.: 726,717

[22] Filed: Jul. 1, 1991

Related U.S. Application Data

[63] Continuation of Ser. No. 533,218, Jun. 4, 1990, abandoned.

[51] Int. Cl.[5] .................... H01Q 1/270; H01Q 1/440; G01R 27/140

[52] U.S. Cl. .................................. 343/718; 343/894

[58] Field of Search .............. 343/718, 703, 741, 742, 343/744, 894, 866, 867; 455/351, 349, 348, 347, 344; 370/93

[56] References Cited

U.S. PATENT DOCUMENTS

| | | | |
|---|---|---|---|
| 3,032,651 | 5/1962 | Stahli et al. | 343/718 |
| 4,713,808 | 12/1987 | Gaskill et al. | 370/93 |
| 4,754,285 | 6/1988 | Robitaille | 343/718 |
| 4,769,656 | 9/1988 | Dickey | 343/718 |
| 4,817,196 | 3/1989 | Macnak et al. | 343/718 |
| 4,873,527 | 10/1989 | Tan | 343/718 |

FOREIGN PATENT DOCUMENTS

| | | | |
|---|---|---|---|
| 0100639 A2 | 7/1983 | European Pat. Off. | 343/718 |
| 0334297 | 9/1989 | European Pat. Off. . | |
| 8805214 | 7/1988 | World Int. Prop. O. . | |

OTHER PUBLICATIONS

Test Procedure for Antennas, IEEE Publication No. 149 Jan. 1965, 32 pages.

*Primary Examiner*—Michael C. Wimer
*Assistant Examiner*—Peter Toby Brown
*Attorney, Agent, or Firm*—Philip P. Macnak; Vincent B. Ingrassia; William E. Koch

[57] ABSTRACT

An apparatus for sensing the integrity of an antenna which is located within a wristband and which is coupled to a wrist worn communication device having a receiver, and an antenna sensing circuit which generates an antenna sensing signal. The antenna sensing circuit monitors the antenna sensing signal and derives an antenna integrity indication signal which indicates the integrity of the antenna. An indicating circuit is responsive to the antenna integrity indication signal and provides a sensible indication of the integrity of the antenna, such as a message indicating the antenna is open.

18 Claims, 9 Drawing Sheets

— PRIOR ART —

APPARATUS FOR SENSING THE INTEGRITY OF A WRISTBAND ANTENNA

This is a continuation of application Ser. No. 07/533,218, filed Jun. 4, 1990 and now abandoned.

BACKGROUND OF THE INVENTION

1. Field of the Invention

The present invention relates generally to the field of wristband antennas for wrist-worn communication devices, and more particularly to an apparatus for sensing the integrity of the wristband antenna.

2. Description of the Prior Art

Due to the small size of wrist-worn communication devices, such as wrist-worn pagers, the antenna system has had to be integrated either wholly, or in part within the wristband of the wrist-worn communication device. One such antenna system which has been utilized in a wrist-worn communication device is described in U.S. Pat. No. 4,873,527 by Tan, entitled "Antenna System for a Wrist Carried Paging Receiver" which provided both a ferrite loop antenna which was located within the housing of the wrist-worn communication device, and a wristband loop antenna which was located within the wristband of the wrist-worn communication device. When a loop antenna was located within the wristband, the loop antenna construction was generally as shown in FIG. 1. Conductors (18, 20) which were integrated within each of the wristband straps (14, 16) were coupled into the device housing to provide the circuit connections to the receiver. The antenna loop was then completed by utilizing the clasp (22), which was normally used to secure the receiver to the user's wrist, to provide the electrical continuity between the conductors located within each of the wristband straps. The integrity of such a wristband loop antenna was dependant on a number of factors, in particular the adequacy of the electrical contact provided by the clasp, the integrity of the conductors within each wristband strap, and the integrity of the connection being provided into the device housing. Maintaining the integrity of a wristband loop antenna was complicated by such factors as flexing of the wristband straps which could over a period of time result in both open circuited conductors within the wristband straps or open circuited connections at the device housing. Both of the problems were at least partly resolved by proper choice of conductor material and providing strain reliefs at the conductor housing interfaces. While such solutions could guarantee the conductor integrity within the wristband sections, such solutions can not guarantee that the user is completely closing the clasp or that contamination build-up is not occurring on the electrical contacts of the clasp, either of which would result in a reduction of the receiver sensitivity. There is a need to be able to sense the integrity of the wristband loop antenna so as to prevent any long term reductions in receiver sensitivity which would ultimately result in the loss of messages being directed to the wrist-worn communication device.

SUMMARY OF THE INVENTION

It is an object of the present invention to provide an apparatus for sensing the integrity of a wristband antenna for a wrist-worn communication device.

It is a further object of the present invention to provide an apparatus for sensing the integrity of a wristband antenna for different antenna configurations.

It is a further object of the present invention to provide an apparatus for sensing the integrity of the wristband antenna which provides an indication of the closure state of the wristband clasp.

It is a further object of the present invention to provide an apparatus for sensing the integrity of the wristband antenna which provides a power saving capability.

An apparatus for sensing the integrity of a wristband antenna used with a wrist worn communication device includes a circuit for sensing the continuity of the wristband antenna. The sensing circuit generates a closure sensing signal which is coupled to the output of the wristband antenna, and therefrom, derives a closure indication signal indicating the continuity state of the wristband antenna. An indicator circuit which is responsive to the closure indication signal sensibly provides an indication to the user of the integrity of the wristband antenna. The apparatus for sensing the integrity of a wristband antenna can be used with any configuration of wristband antenna, and provides a power saving circuit, and a circuit for providing high detection sensitivity.

BRIEF DESCRIPTION OF THE DRAWINGS

The features of the invention which are believed to be novel are set forth with particularity in the appended claims. The invention itself, together with its further objects and advantages thereof, may be best understood by reference to the following description when taken in conjunction with the accompanying drawings, in the several figures of which like reference numerals identify identical elements, in which, and wherein:

DESCRIPTION OF THE PREFERRED EMBODIMENTS

Figure 2:
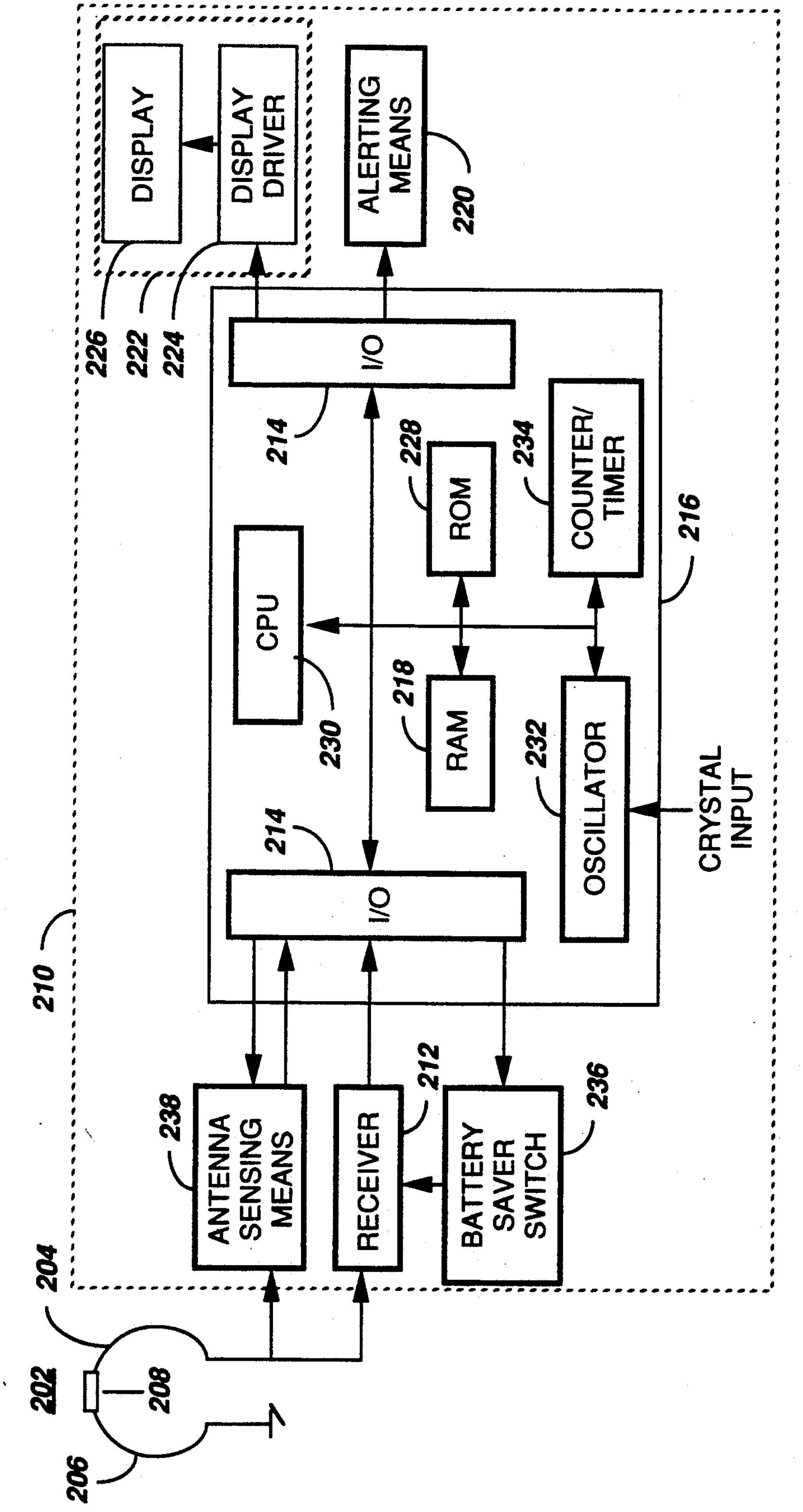
FIG. 2 is an electrical block diagram of the wrist-worn communication device utilizing the apparatus for sensing the integrity of the wristband antenna in accordance with the present invention.

With respect to the figures, FIGS. 2 through 9 are diagrams describing an apparatus for sensing the antenna integrity of a wristband antenna for a wrist-worn communication device. In particular, referring to FIG. 2 is shown an electrical block diagram of a wrist-worn communication device in accordance with the present invention. The wrist-worn communication receiver is shown as having a wristband 202 comprising two wristband straps 204 and 206, and a clasp 208 which is utilized to secure the wrist-worn communication receiver to the user's wrist. Located within each wristband strap is a conductor, which in conjunction with the clasp 208 is utilized to form a loop antenna having an adjustable diameter. Such a wristband loop antenna is described in detail in U.S. patent application Ser. No. 07/299,276 filed Jan. 23, 1989 by Tan et al., which was abandoned and refiled as Ser. No. 572,306, entitled "Reactance Buffered Loop Antenna and Method for Making the Same" which is assigned to the assignee of the present invention, and which is incorporated by reference herein. Each of the wristband straps is mechanically coupled to the housing 210 containing the wrist-worn communication receiver. The conductor located within wrist strap 204 couples the received message signals to the input of the receiver 212. The conductor located within wristband strap 206 couples to the receiver ground, thereby completing the signal path for the received message signals. The output of the receiver portion 212 is coupled through input/output (I/O) port 214 to a microcomputer 216 functioning as a decoder. Transmitted message signals intended for the wristband communication device are intercepted by the wristband antenna 202, coupled to the input of the receiver 212 where they are received and detected in a manner well known in the art. When the messages are transmitted utilizing one of the well known digital selective call signaling formats, such as the POCSAG signaling format or the Golay Sequential Code (GSC) signaling format, the output of the receiver 212 is a stream of binary information representative of the received and detected message signals. The stream of binary information is applied to the input of the microcomputer decoder 216 where the information is decoded in a manner well known in the art. When the information decoded indicates the message is intended for the device, the message is stored within a message memory, such as the random access memory (RAM) 218 of the microcomputer decoder 216. The microcomputer decoder 216, through I/O port 214 also couples a signal to alerting means 220 to sensibly alert the user that a message has been received. The sensible alert provided to the user may be audible, tactile or visual, as is well known in the art. The message may be recalled from memory 218 by the user, whereupon the message is displayed using an indicator means 222. comprising a display driver 224 and a display 226 in a manner well known in the art. In the preferred embodiment of the present invention, display 226 provides a visual display, such as provided with an LCD display.

The firmware to control the operation of the wristband communication device is stored in the microcomputer read only memory (ROM) 228 which contains software routines for such well known functions as decoding the received message signals, storing of the received messages and retrieving the stored messages for display, and control of receiver battery saver. ROM 228 also contains the software for sensing the integrity of the wristband antenna, which will be described in detail below. Each of the operations of the wrist-worn communication device are controlled by the central processing unit (CPU) 230, as the CPU 230 processes each of the device function routines stored in ROM 228. An oscillator 232 provides the reference signal for controlling the timing of the CPU 230 operations, and also provides an input to counter/timer 234 which generates a number of timing functions, such as required to control battery saver operation. Battery saver switch 236 couples to the microcomputer decoder 216 through I/O port 214 and provides the interface for controlling the supply of power to the receiver 212. An antenna sensing circuit 238 also couples to the microcomputer decoder 216 through I/O 214, allowing the microcomputer decoder 216 to function as an antenna sensing means for sensing the integrity of the wristband antenna which will be described in detail below.

Figure 3:
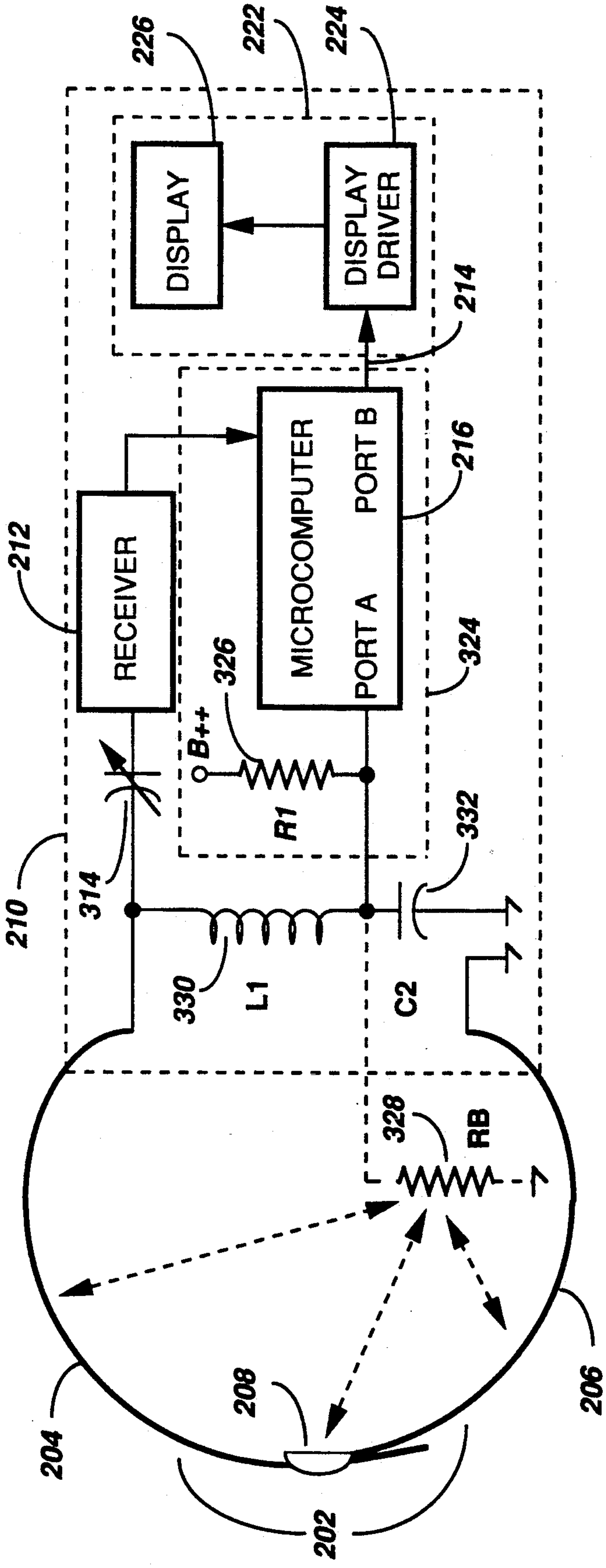
FIG. 3 is an electrical block diagram of a wrist-worn communication device utilizing a first embodiment of the apparatus for sensing the integrity of a wristband antenna in accordance with the present invention.

The apparatus for sensing the integrity of the wristband antenna in accordance with the present invention is shown in a first embodiment in FIG. 3, comprises a sensing means 324, for generating a closure sensing signal which is coupled to the output of the wristband antenna 202. As shown in FIG. 3, one end of the wristband antenna 202 is coupled to the receiver ground through the conductor in wristband strap 206. The opposite end of the conductor in wristband strap 206 couples to the clasp which provides electrical connection to one end of the conductor in wristband strap 204. The opposite end of the conductor in wristband strap 204 couples to one terminal of capacitor 314, and to one terminal of inductor 330. The opposite terminal of inductor 330 couples to the input of sensing means 324 and to one terminal of capacitor 332. The opposite terminal of capacitor 332 couples to the receiver ground. Inductor 330 is used to block radio frequency (RF) energy developed at the input of the receiver 212 from coupling to the input of the sensing means 324, and is also used to couple the closure sensing signal generated by the sensing means 324 to the wristband antenna 202. Capacitor 332 provides additional RF bypassing to the input of the sensing means 324. The input of sensing means 324 couples to one terminal of resistor 326 and to an I/O port of microcomputer 216. The second terminal of resistor 326 couples to one of the receiver supply voltages, in this instance to the B++ supply voltage, which is also used to power the microcomputer 216.

As will be appreciated by the diagram of FIG. 3, in the first embodiment in accordance with the present invention, the closure sensing signal is a continuously generated direct current (DC) signal, the magnitude of which is controlled by the series combination of resistor (R1) 326, the resistance of inductor 330, and the equivalent wristband antenna resistance (RB) 328. The equivalent wristband resistance 328, as indicated in FIG. 3, includes the resistance of the conductors within each wristband strap, the contact resistance of the closed clasp, and any other resistance encountered between the receiver ground and the sensing circuit input. During operation, such as when the clasp is properly closed, the equivalent wristband resistance 328 is low, such as from 5 to 35 ohms, including the resistance of the inductor (L1) 330 which is on the order of two to twenty ohms, depending upon the inductor construction. In the preferred embodiment of the present invention, resistor 326 will have a value of from 5 kilo-ohms (KΩ) to 100KΩ. As a result, resistor 326 provides a means for generating a predetermined current, essentially controlling the current which is generated by the sensing means 324 to the wristband antenna 202. The current passing through equivalent wristband resistance 328, generates a voltage across wristband equivalent resistance 328, a closure indication signal, which is coupled to the input of the sensing means 324 indicating the closure state of the clasp 208 as well as the overall integrity of the wristband loop antenna 202. The closure sensing signal developed at the input port 214 of microcomputer 216 is periodically sampled at predetermined time intervals to be described below. When the sampled voltage remains below a predetermined threshold as will be described in detail below, the antenna integrity is determined to be acceptable. However, when the sampled voltage is above the predetermined threshold, such as when the clasp is improperly latched, unlatched, or an open exists within the antenna circuit, the microcomputer 216 will generate a closure indication signal at I/O port 214 which is coupled to the indicating means 222, providing to the user a sensible alert indicating the current closure state of the clasp or indicating a state of the overall integrity of the antenna. In the preferred embodiment of the present invention, a message, such as "clasp open" would be displayed on the LCD display 226. It will be appreciated other methods of providing a sensible indication, such as illuminating an icon on the LCD display, or generating an audible alert can be used as well.

In the preferred embodiment of the present invention, a microcomputer, such as an MC68HC05C4 microcomputer as manufactured by Motorola, Inc., is utilized. As such, the threshold for detection of an open band versus a closed band is predetermined by the logic voltage levels required at the input port 214 of the microcomputer port 216 to discriminate between a logic "zero" state and a logic "one" state. As an example, when a ten KΩ resistor is used for resistor 326, and a supply voltage of 3.0 volts is provided for the B++ supply, a current of approximately 300 micro-amperes (μAmp) is generated when the condition of the wristband antenna is normal. It will be appreciated that at this current level, when the clasp 208 of the wristband is properly closed, and the antenna circuit is intact, a very low voltage is generated at the input of the microcomputer 216. However, when the clasp 208 is improperly closed, or has a significant build-up of dirt or other foreign material on the antenna contacts, or one of the conductors of the wristband antenna is open, a voltage in excess of the minimum logic "one" voltage level can readily be generated at the input of the microcomputer 216 resulting in the warning message indicating the clasp is "open" to be generated. For a minimum logic "one" voltage requirement of 2.1 volts (0.7×VDD for the MC68HC05C4), an open band condition will be indicated when the equivalent wristband resistance 328 is in excess of thirty-three hundred ohms.

Figure 4:
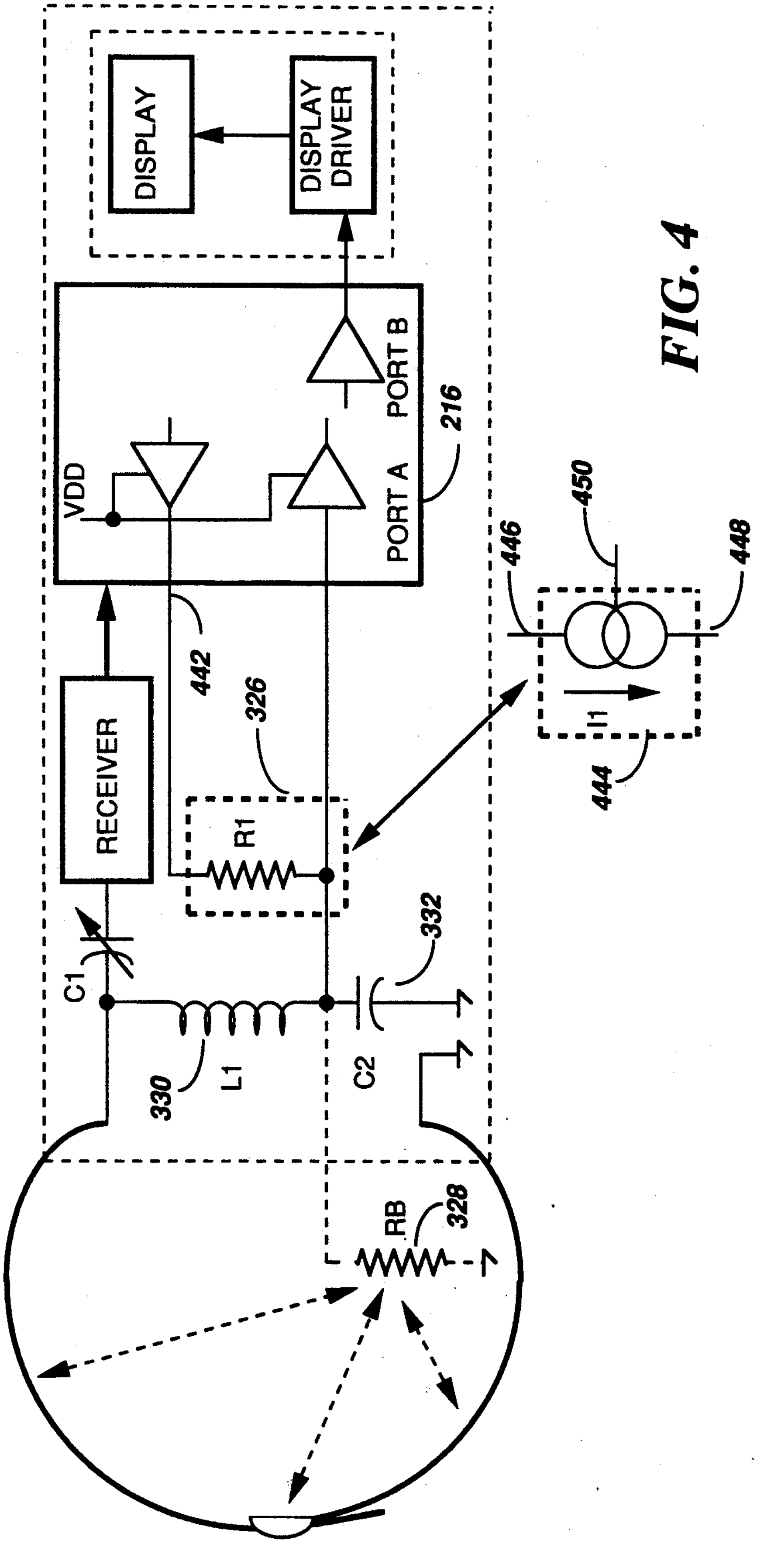
FIG. 4 is an electrical block diagram of a wrist-worn communication device utilizing a second embodiment of the apparatus for sensing the integrity of a wristband antenna in accordance with the present invention with power saving.

FIG. 4 is an electrical block diagram of a wrist-worn communication device in accordance with a second embodiment of the present invention. In particular, a power saving means is shown for controlling the supply of power to resistor 326. Since the operation of the sensing circuit is the same as that described in FIG. 3, only the differences in operation between the circuits of FIG. 3 and FIG. 4 will be described below. Unlike resistor 326 which is coupled directly to the B++ supply voltage, as shown in FIG. 3, the supply voltage side of resistor 326 of FIG. 4 is coupled to a separate I/O port 442 which is used to control the supply of power to resistor 326. In this manner, power is periodically supplied to resistor 326 only during the period of time during which the microcomputer 216 samples for sensing the integrity of the antenna circuit.

As also shown in FIG. 4, in addition to the use of a fixed resistor for resistor 326, it will be appreciated, other methods of generating a current, such as an integrated switchable current reference, or source, 444 which can be controlled by the microcomputer 216 can be utilized as well. When a switchable current source is used, one terminal 446 of the current source is coupled to the supply voltage, a second terminal 448 is coupled to the input of the sensing means at the junction of inductor 330 and capacitor 332, and the control terminal 450 is coupled to the I/O port 442. In the embodiment of FIG. 4, the microcomputer 216 functions as a controller, or controller means, to control the generation of the closure sensing signal at periodic intervals at which time the integrity of the antenna is sensed, as described above.

Figure 5:
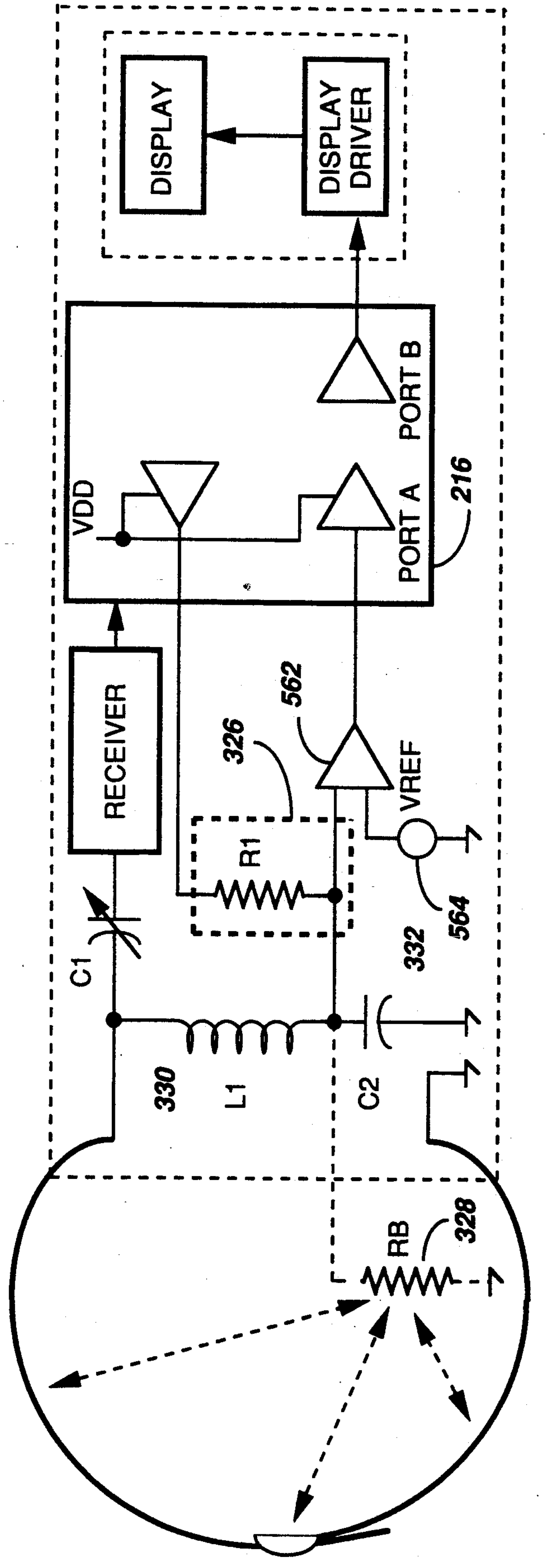
FIG. 5 is an electrical block diagram of a wrist-worn communication device utilizing a third embodiment of the apparatus for sensing the integrity of a wristband antenna including power saving and high detection sensitivity in accordance with the present invention.

FIG. 5 is an electrical block diagram of a wrist-worn communication device in accordance with a third embodiment of the present invention. As shown in FIG. 5, instead of coupling resistor 326 directly to the microcomputer 216 through the I/O port, one terminal of resistor 326 couples to one input of a voltage comparator 562, the second input of voltage comparator 562 being coupled to a voltage reference 564. Voltage comparators for use for comparing voltages are well known in the art. Voltage reference 564 allows adjusting the comparator threshold voltage to a value other than predetermined by the sensitivity of the microcomputer, I/O port. When the voltage reference 564 is set to a lower threshold value than provided by the microcomputer I/O port, such as for example, thirty-six millivolts, a detection threshold sensitivity of approximately one hundred ohms is obtained using an 8.2KΩ resistor for resistor 326. Because such sensitivity borders on the actual resistance value of the antenna circuit, the third embodiment of the present invention is capable of sensing changes within the resistance of the elements of the antenna which would normally create degradation in the antenna performance, and would warn the user of such changes long before significant degradation of the antenna performance is encountered.

Figure 6:
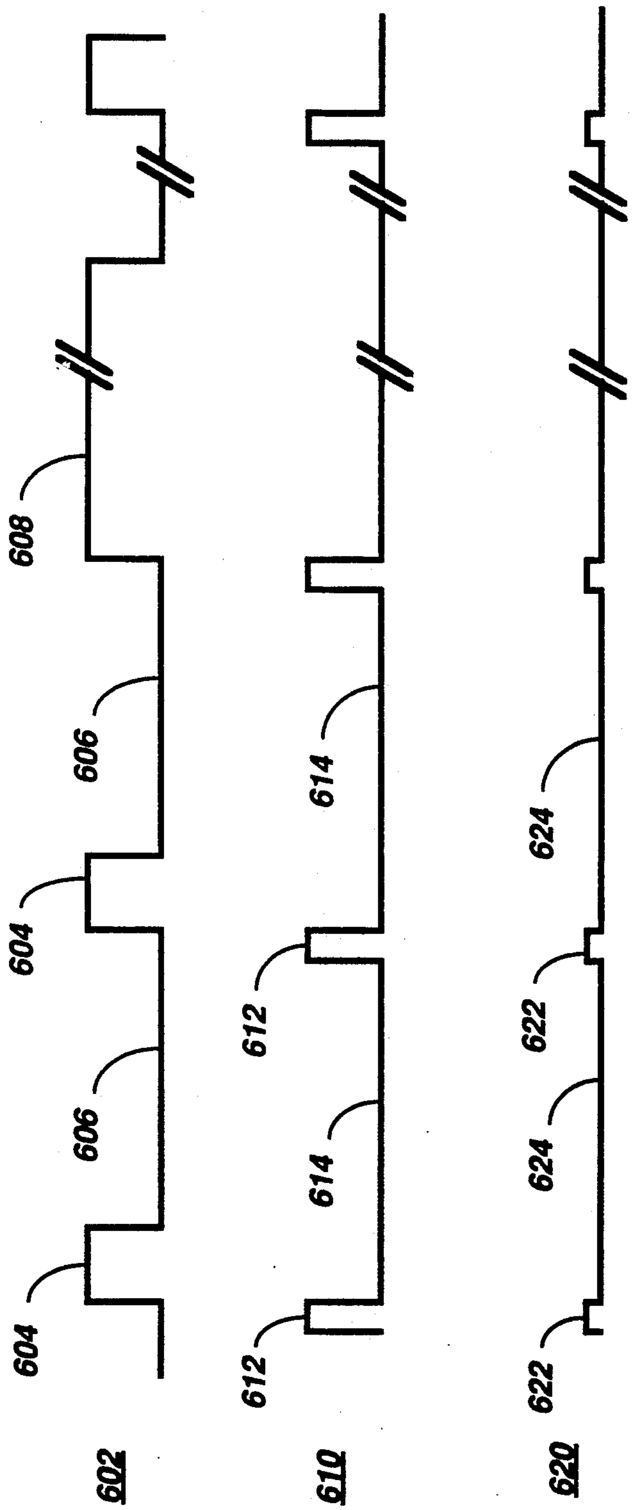
FIG. 6 is a timing diagram illustrating the operation of the second and third embodiments in accordance with the present invention.

FIG. 6 is a timing diagram illustrating the operation of the second and third embodiments in accordance with the present invention when power saving operation is provided. Waveform 602 shows the supply voltage being supplied to the receiver of the wrist-worn communication device. As shown, power is periodically applied to the receiver by the battery saver switch during time intervals 604, and power is periodically suspended to the receiver during time intervals 606, to provide a battery saving operation in a manner well known in the art. During time interval 608, it will be appreciated, information has been detected on the channel, and the supply of power is extended to allow for receiving and detecting any messages which are intended for the wrist-worn communication device. Waveform 610 illustrates the supply of power by the microcomputer port which is used to control the generation of the closure sensing signal or current. As shown in waveform 610, the closure sensing current is generated during time intervals 612 and is suspended during time interval 614. For the preferred embodiment of the present invention, the periodic monitoring of the antenna integrity occurs during a period of time just prior to the time power is being supplied to the receiver. By generating the sensing current during the time when the receiver is not operational, desensitization of the receiver by microcomputer generated noise is avoided. The closure indication signal derived from the current passing through the antenna is shown by waveform 620. When current is provided to the antenna at time intervals 622, the magnitude of the voltage generated is indicative of the antenna integrity, as previously described.

Figure 1:
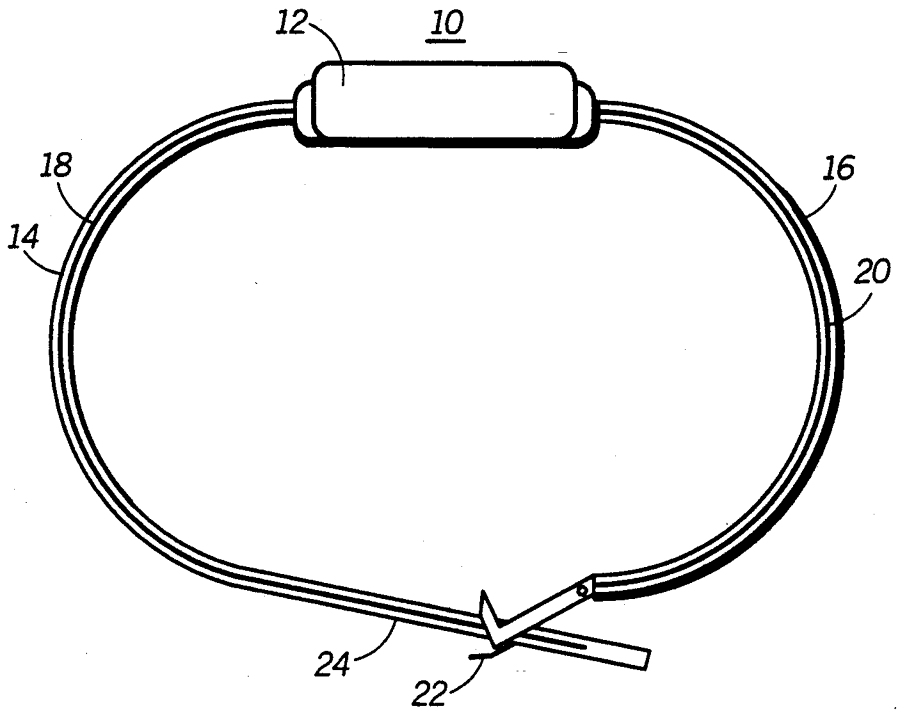
FIG. 1 is pictorial diagram of a prior art wrist-worn communication device utilizing a wristband antenna.
Figure 7:
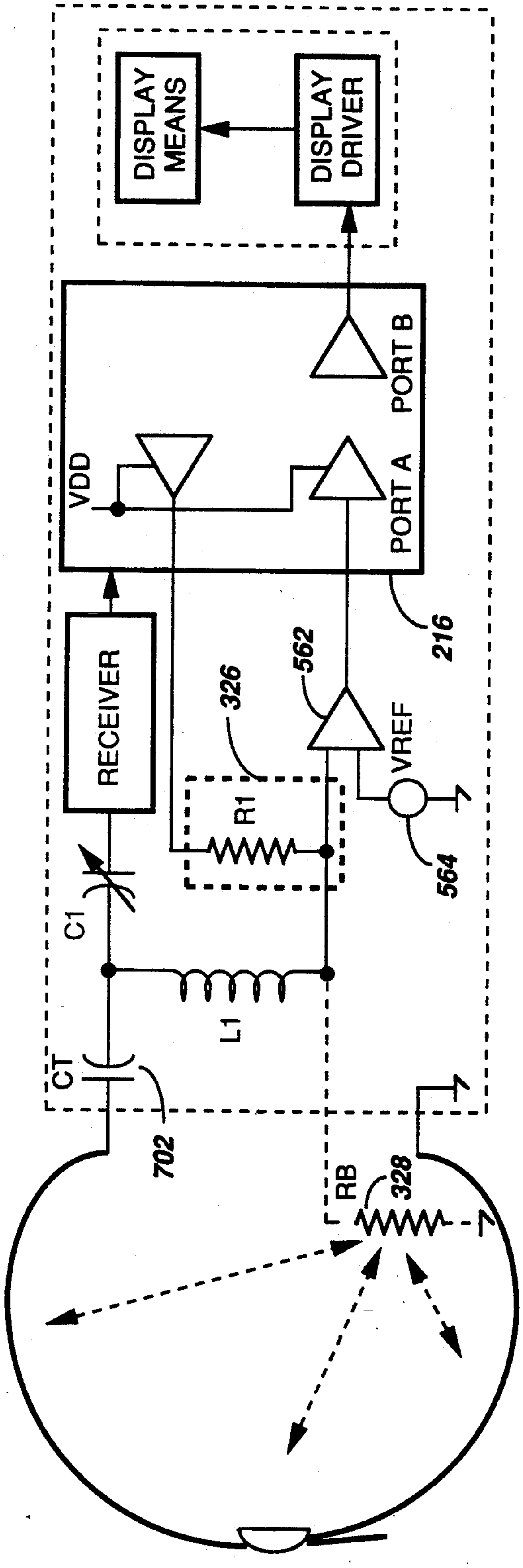
FIG. 7 is an electrical block diagram of a wrist-worn communication device utilizing a fourth embodiment of the apparatus for sensing the integrity of a wristband antenna including series capacitor elements in accordance with the present invention.
Figure 8:
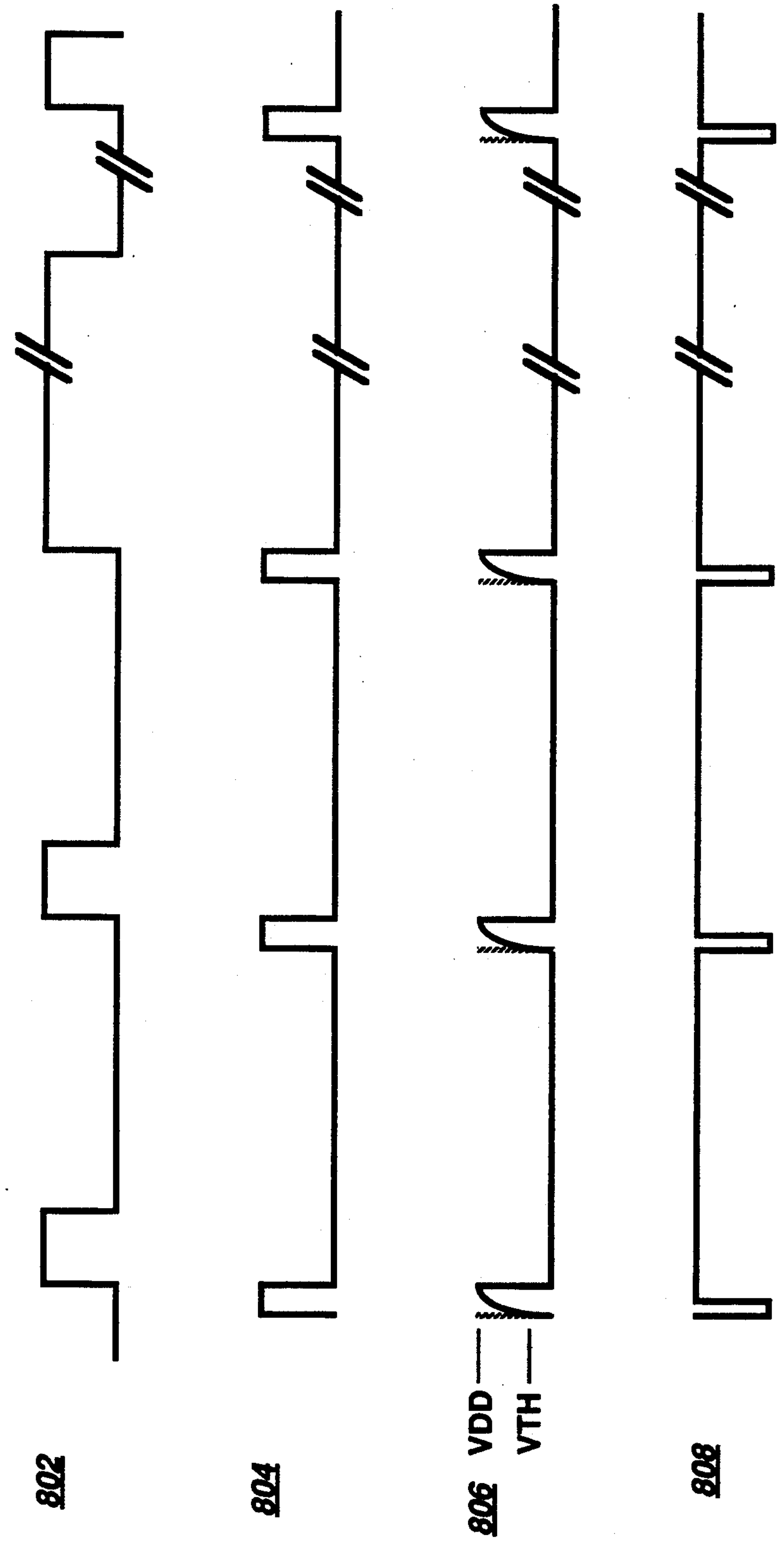
FIG. 8 is a timing diagram illustrating the operation of the fourth embodiment in accordance with the present invention.

FIG. 7 is an electrical block diagram of a wrist-worn communication device in accordance with a fourth embodiment of the present invention. When operating the receiver, as for example, in the 150 Megahertz frequency range, the inductance of the conductors used to form the wristband loop antenna is generally too large to be resonated at the receiver operating frequency. In this instance, one or more capacitors 702 are placed in series with the antenna conductors to reduce the inductance sufficiently so that the antenna may be tuned. By placing one or more capacitors in series with the antenna elements, the DC current method of FIG. 1 for sensing the integrity of the antenna cannot be utilized. However, the pulsed current methods of FIGS. 3 and 4, can be used in the manner described below. When an antenna is utilized which incorporates series capacitors for tuning, the power saving mode of operation provides the means for detecting the integrity of the wristband antenna as shown in FIG. 8. Waveform 802 is as previously described showing the supply of power to the receiver. Waveform 804 represents power being switched to resistor 326 by the microcomputer I/O port. As power is supplied to resistor 326, the voltage at the input of comparator 562 of FIG. 7 drops below the comparator threshold voltage, VTH, as shown by waveform 806 due to the series capacitors as representing an instantaneous short circuit, and then begins to rise as capacitor 702 is charged by the current being delivered by resistor 326. Resistor 326 is selected to extend the pulse width sufficiently to obtain a pulse that is generated at the output of comparator 562, as shown by waveform 808, the duration of which is controlled by the time the voltage developed across capacitor 702 remains below the comparator threshold voltage. The pulse so generated is readily detected during the sampling interval by the microcomputer. When the voltage across the capacitor 702 initially fails to fall below the voltage comparator threshold voltage VTH no pulse is generated, thereby providing an indication of the clasp being open or dirty, or an antenna conductor being open. During the sampling interval when no pulse is detected, the microcomputer responds by generating the warning indication. When the antenna sensing circuit of the present invention is used with an antenna having a series tuning capacitor, as described above, the decoupling capacitor 332 (as described in previous embodiments) is omitted at the input of the sensing circuit.

Figure 9:
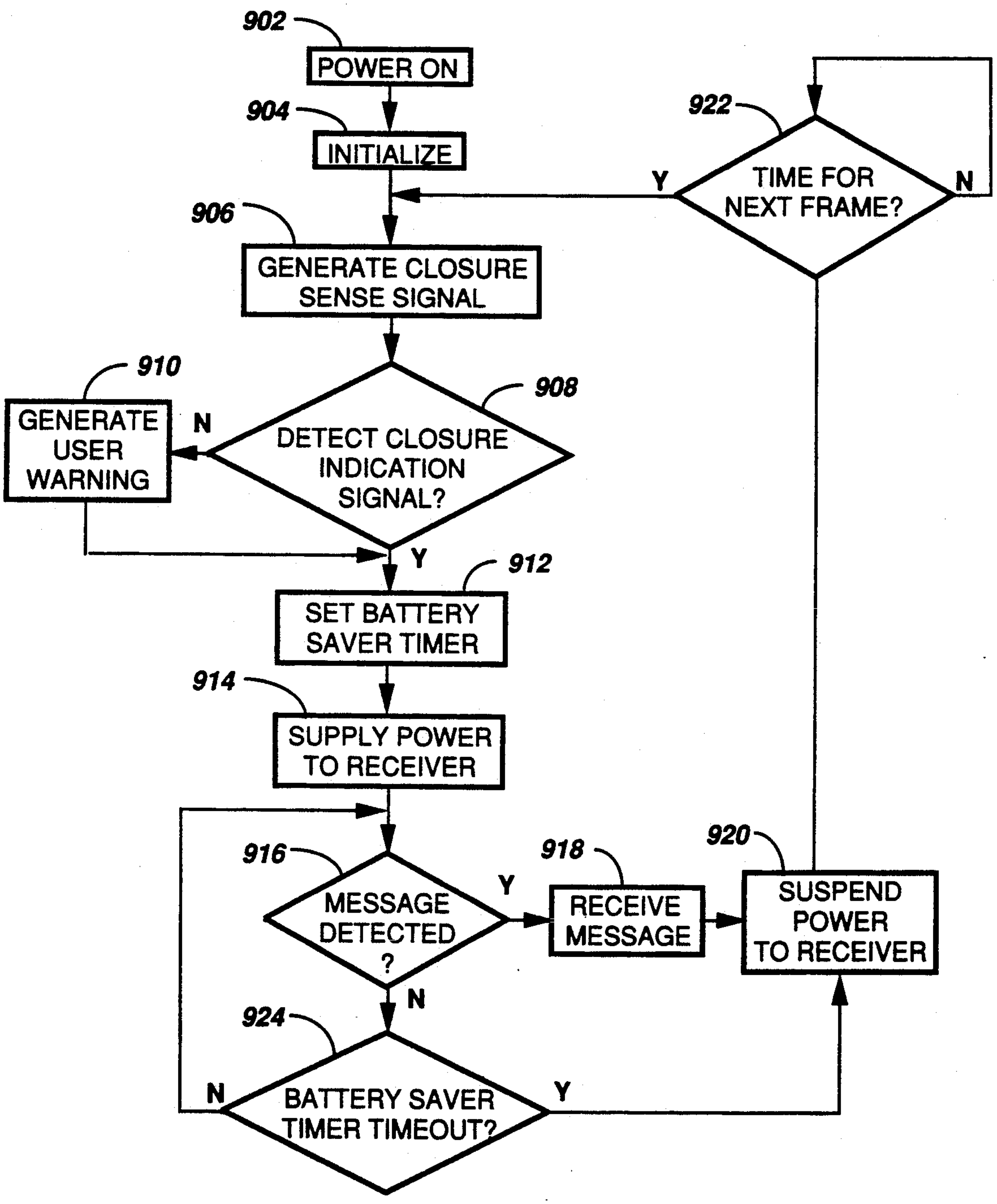
FIG. 9 is a flow chart illustrating the operation of the apparatus for sensing the integrity of a wristband antenna in accordance with the present invention.

FIG. 9 is a flow chart illustrating the operation of the apparatus for assuring antenna integrity in accordance with the present invention. When power to the wrist-worn device is turned on, at step 902, the microcomputer is initialized, at step 904, in a manner well known in the art, to begin the process of receiving messages. During the sampling time prior to the time power is supplied to the receiver, the microcomputer activates the I/O port to generate a closure sense signal, at step 906. When a closure indication signal is not detected, at step 908, a warning is generated to alert the user of the wrist-worn device of a problem, at step 910. The warning may be visual, such as indicating "clasp open", or "band open", or may be audible such as a unique audible alert sequence. When the closure indication signal is detected, at step 908, or after a warning is generated, at step 910, the battery saver timer is set, at step 912, and power is supplied to the receiver, at step 914. When information is detected on the channel which may indicate a message intended for the wrist-worn communication receiver may be transmitted, at step 918, power is maintained to the receiver. After the message has been received, or when it is determined a message is not intended for the wrist worn communication receiver, power is suspended to the receiver, at step 920. When a message is not immediately detected, at step 916, and the battery saver timer has not timed out, at step 924, power is maintained to the receiver while the information being received is being processed to determine if a message is present. When a message is not detected, at step 916, and the battery saver timer has timed out, at step 924, the supply of power to the receiver portion is suspended, at step 920. When it is time to restore power to the receiver for the next scheduled frame, such as in a POCSAG signaling system, or during the next predetermined time interval as in many of the asynchronous signaling format systems, at step 922, a closure sense signal is again generated, at step 906, and the process for sensing the integrity of the wristband antenna is repeated as described above.

While the operation of the apparatus to sense antenna integrity has been described above as periodically generating a closure sense signal, such as at step 906, prior to each receiver battery saver operation cycle, it will be appreciated the closure sensing signal may be generated at other time intervals as well. Sampling time intervals, such as at every tenth battery saver time interval, or of once each minute, may also be utilized without an appreciable reduction in the antenna sensing circuit's ability to alert the user of potential problems. It will also be appreciated, that while the generation of the closure sensing signal has been described as being prior to the time interval during which power is supplied to the receiver, the closure sensing signal may also be generated at any other convenient time interval, such as after power has been suspended to the receiver during each battery saver duty cycle. While the description provided above specifically described the wristband antenna as having a clasp, it will be appreciated the apparatus of the present invention to sense the integrity of a wristband antenna may be utilized with any configuration of wristband antennas, such as a single element extensible wristband having extensible antenna conductors.

In summary, an apparatus for sensing the integrity of a wristband antenna for a wrist-worn communication device has been described. The apparatus provides a means for periodically sensing that the wristband clasp is closed properly, and that the integrity of the conductive elements of the antenna is maintained. A battery saving method is provided which minimizes the current drain required during the sensing operation, and secondarily minimizes potential interference between the operation of the receiver and of the microcomputer.

The apparatus of the present invention may be utilized with antennas which provide a direct current path for the sensing signal, and may also be used with antennas which incorporate series capacitors which are used to resonate the antenna loop.

While specific embodiments of this invention have been shown and described, further modifications and improvements will occur to those skilled in the art. All modifications which retain the basic underlying principles disclosed and claimed herein are with the scope and spirit of the present invention.

We claim:

1. A wrist worn communication device including means for providing an antenna integrity indication to the user, said device comprising:

a receiver;

a wristband, including an antenna located therein coupled to said receiver, said antenna having an equivalent resistance associated therewith;

antenna sensing means coupled to said antenna for generating an antenna sensing signal based on said equivalent resistance and for deriving therefrom a closure indication signal indicating the integrity of said antenna; and indicating means, responsive to the closure indication signal, for providing a sensible indication of the integrity of said antenna to the user.

2. The wrist worn communication device of claim 1 wherein said antenna sensing means comprises:

current generating means, coupled to said antenna, for generating the antenna sensing signal; and controller means, responsive to the antenna sensing signal being coupled to said antenna, for deriving the closure indication signal.

3. The wrist worn communication device of claim 2 wherein said current generating means is a fixed resistor.

4. The wrist-worn communication device of claim 2 wherein said current generating means is a current source.

5. The wrist worn communication device of claim 4 wherein said current source is switchable for selectively supplying current.

6. The wrist worn communication device of claim 2 wherein said controller means comprises a microcomputer.

7. The wrist worn communication device of claim 2 wherein said controller means includes power saving means for controlling the supply of power to said current generating means.

8. The wrist worn communication device of claim 7, wherein said controller means further includes timing means, and wherein said power saving means is responsive to said timing means for periodically supplying power to said current generating means.

9. The wrist worn communication device of claim 8, wherein the wrist-worn device includes battery saving means which is responsive to said timing means for periodically supplying power for predetermined time intervals to said receiver, and wherein said power saving means is further responsive to said timing means for supplying power to said current generating means during time intervals other than the predetermined time intervals for supplying power to the receiver.

10. The wrist worn communication device of claim 2, wherein said antenna sensing means further comprises:

voltage reference means, for generating a predetermined reference voltage signal; and voltage comparing means, coupled to said controller means, and responsive to the predetermined reference voltage signal and to the antenna sensing signal, for generating a control signal, said controller means being responsive to the control signal for generating the closure indication signal.

11. The wrist worn communication device of claim 1, wherein said loop antenna includes at least one series capacitor for at least partially resonating said loop antenna to a receiver operating frequency.

12. The wrist worn communication device of claim 1 wherein said antenna comprises:

two wristband strap sections including a clasp for mechanically securing the device to the user's wrist, and for electrically completing the circuit of said loop antenna, wherein the closure indication signal provides an indication of the closure state of said clasp, and further provides an indication of the integrity of said loop antenna.

13. The wrist worn communication device of claim 12, wherein said loop antenna includes at least one series capacitor for at least partially resonating said loop antenna to a receiver operating frequency.

14. The wrist worn communication device of claim 12 wherein said indicating means generates a visual indication of the closure state of the clasp.

15. A wrist worn communication device including means for providing an antenna integrity indication to the device user, said device comprising:

a receiver;

a wristband, including an antenna located therein coupled to said receiver;

antenna sensing means for generating an antenna sensing signal which is coupled to said antenna, and for deriving therefrom a closure indication signal indicating the integrity of said antenna;

power saving means, coupled to said antenna sensing means, for controlling the supply of power thereto;

battery saving means, coupled to said receiver, for controlling the supply of power thereto;

timing means for generating timing signals, said battery saving means being responsive to said timing means for periodically supplying power to said receiver for predetermined time intervals, and said power saving means is further responsive to said timing means for supplying power to said antenna sensing means during time intervals other than the predetermined time intervals provided for supplying power to said receiver; and indicating means, responsive to the closure indication signal, for providing a sensible indication of the integrity of said antenna to the user.

16. The wrist worn communication device of claim 15 wherein said antenna sensing means comprises:

current generating means, coupled to said antenna, for generating the antenna sensing signal; and controller means, responsive to the antenna sensing signal being coupled to said antenna, for deriving the closure indication signal.

17. The wrist worn communication device of claim 16 wherein said controller means comprises a microcomputer.

18. The wrist worn communication device of claim 16, wherein said antenna sensing means further comprises:

voltage reference means, for generating a predetermined reference voltage signal; and voltage comparing means, coupled to said controller means, and responsive to the predetermined reference voltage signal and to the antenna sensing signal, for generating a control signal, said controller means being responsive to the control signal for generating the closure indication signal.

* * * * *